United States Patent [19]

Kapral et al.

[11] Patent Number: 4,508,982
[45] Date of Patent: Apr. 2, 1985

[54] FLOATING NODE STABILIZING CIRCUIT FOR A SWITCHED-CAPACITOR CIRCUIT AND FILTER

[75] Inventors: Christopher W. Kapral, Pasadena, Calif.; Michael Cooperman, Framingham, Mass.

[73] Assignee: GTE Laboratories Incorporated, Waltham, Mass.

[21] Appl. No.: 426,353

[22] Filed: Sep. 29, 1982

[51] Int. Cl.³ .................... H03K 17/16; H03K 17/693
[52] U.S. Cl. ..................... 307/572; 307/246; 307/520; 328/167; 333/173
[58] Field of Search .......... 333/165, 166, 173; 328/151, 167; 307/520, 521, 353, 543, 546, 246, 247 R, 572

[56] References Cited

U.S. PATENT DOCUMENTS

| 4,266,205 | 5/1981 | Betzl et al. | 333/165 |
| 4,320,362 | 3/1982 | Bellanger et al. | 333/165 |
| 4,383,228 | 5/1983 | Gaillard | 333/173 |

FOREIGN PATENT DOCUMENTS

| 0015343 | 9/1980 | European Pat. Off. | 333/173 |
| 0159614 | 12/1980 | Japan | 333/165 |

OTHER PUBLICATIONS

Broderson et al., "MOS Switched-Capacitor Filters", Proceedings of the IEEE, vol. 67, No. 1, Jan. 1979, pp. 61-75.

Primary Examiner—Stanley D. Miller
Assistant Examiner—D. R. Hudspeth
Attorney, Agent, or Firm—Fred Fisher

[57] ABSTRACT

A pair of fixed capacitors are connected across a pair of serially coupled switched capacitors, the junction of the fixed capacitors being coupled to the floating node of the switched capacitors. As the polarities of the switched capacitors are switched, the fixed capacitors cause a partial discharge, thereby preventing charge from accumulating on the node.

4 Claims, 12 Drawing Figures

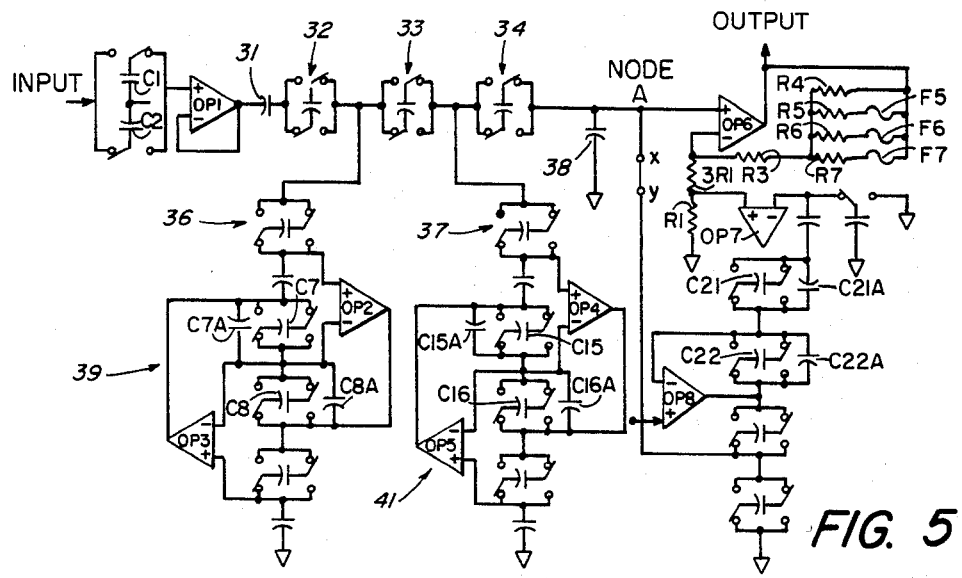
FIG. 5
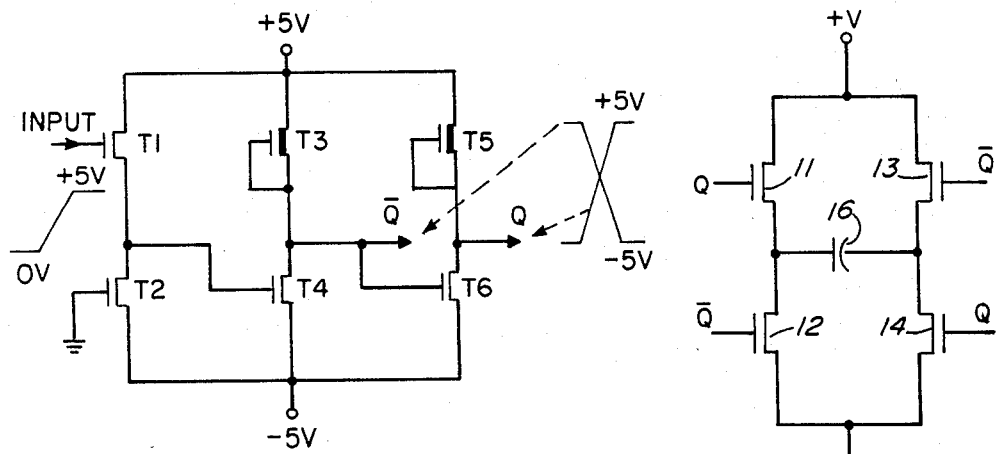
FIG. 10
FIG. 4

FLOATING NODE STABILIZING CIRCUIT FOR A SWITCHED-CAPACITOR CIRCUIT AND FILTER

BACKGROUND OF THE INVENTION

1. Field of the Invention

This invention relates to a capacitor-switched filter stabilizing circuit, and in particular to a floating node corrected, integrated switched-capacitor frequency-dependent negative resistance (FDNR) filter. Accordingly, it is a general object of this invention to provide new and improved circuits and filters of such character.

2. General Background

A conventional low-pass filter includes serial inductances and shunt capacitances, together with an input resistance and a load resistance.

By dividing the values of the various reactances of the elements by $j\omega$, an inductance is replaced by a resistor, a capacitor is replaced by an active circuit, and a resistor is replaced by a capacitor. The advantage of such a circuit, consisting of resistors, capacitors, and operational amplifiers, is that it contains no inductors and can therefore be integrated on an LSI (large-scale-integration) chip. However, the required resistor values of several megohms make integration inefficient.

The inefficiency of high resistance values can be overcome by substituting switched capacitors for resistors. Normally, a capacitor can not conduct direct current. However, by repetitively reversing the plates of each capacitor across a direct current source, the charges on the plates repeatedly change polarity, thereby resulting in an average dc current through the capacitor. This type of filter technique is described in detail in "Switched-Capacitor Filter Design Using the Bilinear Z-Transform", Gabor C. Temes, et al., *IEEE Transactions on Circuits and Systems*, December, 1978, pp. 1039-1043.

Switched capacitor filters are of special interest because high precision RC filters can be provided on integrated circuit chips by using MOS switched capacitor technology. Using this technique, the RC values become a function of capacitor ratios, which can be very accurately controlled.

Switched capacitor filters that employ a frequency-dependent negative resistance (FDNR) closely simulate LC filters, thereby retaining their pass-band insensitivity. They can be made tunable and can be designed directly from LC filter tables.

The repetitive operation of a pair of serially connected switched-capacitor resistors tends to cause a charge to accumulate at their junction, creating a "floating node", problem. This accumulated charge alternates between the two switched capacitors, as they are switched, causing a square wave at the switching frequency to appear at their junction when the voltage across the capacitors is zero. When the voltage across the capacitors is not zero, it adds to the square wave, causing associated amplifiers to clip the composite signal, thereby disrupting operation.

SUMMARY OF THE INVENTION

Another object of the invention is to overcome the floating node problem previously associated with the FDNR approach.

Still another object of this invention is to provide a new and improved capacitor-switched filter stabilizing circuit in which an undesired charge is prevented from accumulating on a junction of two coupled switched capacitors.

In accordance with one embodiment of the invention, an improvement in a switched capacitor filter is provided. The filter includes two switching capacitors. One switching capacitor is adapted to have its plates alternately switched across a first voltage potential and a nodal point. The other switching capacitor is adapted to have its plates alternately switched across the nodal point and a second voltage potential. The switching of the two switching capacitors occurs simultaneously whereby repetitive switching tends to cause an undesirable charge to accumulate at the nodal point. The improvement, which prevents the undesirable charge from accumulating at the nodal point, includes a first fixed capacitor coupled across the first voltage potential and the nodal point, and a second fixed capacitor coupled across the second voltage potential and the nodal point.

In accordance with another embodiment of the invention, a frequency dependent negative resistance filter with floating node correction includes an input terminal, a first capacitor, a first switched capacitor resistor, a second switched capacitor resistor, a third switched capacitor resistor, and an output terminal coupled in serial order. A first shunt path, between the coupling of the first and second switched capacitor resistors and a point of reference potential, includes a fourth switched capacitor resistor, a second capacitor, a fifth switched capacitor resistor, a sixth switched capacitor resistor, a seventh switched capacitor resistor, and a third capacitor, coupled in serial order. An input terminal of one polarity of a first operational amplifier is coupled to a junction of the fourth switched capacitor resistor and the second capacitor. The input terminal of the opposite polarity of the operational amplifier is coupled to the junction of the fifth and sixth switched capacitor resistors. Its output terminal is coupled to the junction of the sixth and seventh switched capacitor resistors. A second operational amplifier has an input terminal of the one polarity coupled to the junction of the seventh switched capacitor resistor and the third capacitor. The other input terminal of the opposite polarity of the second operational amplifier is coupled to the junction of the fifth and sixth switched capacitor resistors. Its output terminal is coupled to a junction of the fifth switched capacitor resistor and the second capacitor. A first fixed capacitor is coupled across the fifth switched capacitor resistor. A second fixed capacitor is coupled across the sixth switched capacitor resistor. A second shunt path, across the coupling of the second and third switched capacitor resistors and the point of reference potential, includes an eighth switched capacitor resistor, a fourth capacitor, a ninth switched capacitor resistor, a tenth switched capacitor resistor, an eleventh switched capacitor resistor, and a fifth capacitor coupled in serial order. A third operational amplifier has an input terminal of the one polarity coupled to a junction of the eighth switched capacitor resistor and the fourth capacitor. A second input terminal of the opposite polarity is coupled to a junction of the ninth and tenth switched capacitor resistor. Its output terminal is coupled to a junction of the tenth and eleventh switched capacitor resistors. A fourth operational amplifier has a first input terminal of the one polarity coupled to a junction of the eleventh switched capacitor resistor and the fifth capacitor. Its second input terminal of the opposite polarity is coupled to a junction of the ninth and tenth switched capacitor resistors. Its output terminal is coupled to a junction of the ninth switched capacitor resistors and the fourth capacitor. A third fixed capacitor is coupled across the ninth switched capacitor resistor. A fourth fixed capacitor is coupled across the tenth switched capacitor resistor. A third shunt path, including a sixth capacitor, is coupled across the output terminal and the point of reference potential.

In accordance with yet another embodiment of the invention, a combination includes two switching capacitors, two fixed capacitors, and eight MOS transistors. The source electrode of the first MOS transistor is coupled to a first electrical junction. The drain electrode of the second MOS transistor is coupled to a nodal point. The drain electrode of the first MOS transistor and the source electrode of the second MOS transistor are coupled to one of the plates of the first switching capacitor. The gate electrodes of the first and the second MOS transistors are adapted to receive a bipolar gating signal and an inverted version thereof, respectively. The source electrode of the third MOS transistor is coupled to the first electrical junction. The drain electrode of the fourth MOS transistor is coupled to the nodal point. The drain electrode of the third MOS transistor and the source electrode of the fourth MOS transistor are coupled to the other plate of the first switching capacitor. The gate electrodes of the fourth and the third MOS transistors are adapted to receive the bipolar gating signal and the inverted version thereof, respectively. The source electrode of the fifth MOS transistor is coupled to the nodal point. The drain electrode of the sixth MOS transistor is coupled to a second electrical junction. The drain electrode of the fifth MOS transistor and the source electrode of the sixth MOS transistor are coupled to one of the plates of the second switching capacitor. The gate electrodes of the fifth and the sixth MOS transistors are adapted to receive the bipolar gating signal and an inverted version thereof, respectively. The seventh MOS transistor has its source electrode coupled to the nodal point. The drain electrode of the eighth MOS transistor is coupled to the second electrical junction. The drain electrode of the seventh MOS transistor and the source electrode of the eighth MOS transistor are coupled to the other plate of the second switching capacitor. The gate electrodes of the eighth MOS transistor and the seventh MOS transistor are adapted to receive the bipolar gating signal and an inverted version thereof, respectively. The first fixed capacitor is coupled across the first junction and the nodal point. The second fixed capacitor is coupled across the nodal point and the second junction.

In accordance with still another embodiment of this invention, means are provided for alternately (1) coupling one plate of a first capacitor to a first source of voltage potential, the other plate thereof to one plate of a second capacitor as a nodal point, and the other plate of the second capacitor to a second source of voltage potential, and (2) coupling the other plate of the first capacitor to the first source of voltage potential, the one plate of the first capacitor to the other plate of the second capacitor as the nodal point, and the one plate of the second capacitor to the second source of voltage potential. A plate of a third capacitor is adapted to be coupled to the first source of voltage potential, a second plate thereof being coupled to the nodal point. One plate of a fourth capacitor is coupled to the nodal point, the other plate thereof being adapted to be coupled to the second source of voltage potential.

BRIEF DESCRIPTION OF THE DRAWING

Other objects, advantages, and features of this invention, together with its construction and mode of operation, will become more apparent from the following description, when read in conjunction with the accompanying drawing, in which:

FIG. 4 is an electronic equivalent of the switched capacitor of FIG. 3 including four MOS transistors coupled to the switched capacitor to provide the switching function thereto;

FIG. 5 is a circuit diagram of a complete frequency dependent negative resistance (FDNR) filter with floating node correction, in accordance with one embodiment of this invention;

FIG. 10 is a circuit diagram of a switching driver, helpful for driving a switching capacitor used in conjunction with this invention.

DESCRIPTION OF PREFERRED EMBODIMENT

Figure 1:
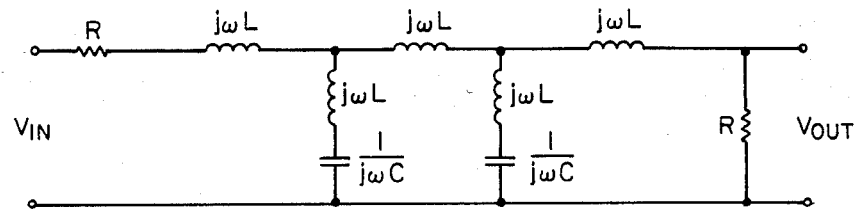
FIG. 1 illustrates a conventional LC low pass filter, helpful for understanding an embodiment of the invention.

FIG. 1 illustrates a conventional LC low pass filter, including inductors and capacitors, which can provide proper performances for telephone usage.

Since inductors cannot be implemented on an integrated circuit chip, it is desirable to remove them without altering the filter transfer function. This is achieved by dividing each element by $j\omega$ (where $\omega$=angular frequency). The inductors are replaced by resistors, the resistors are replaced by capacitors, and the capacitors with a new active circuit, all as shown in FIG. 2.

Assume initially that the reactances of the resistors, inductors, and capacitors of FIG. 1 are R, $j\omega L$, and $1/j\omega C$ respectively, where $\omega$=angular frequency, and R, L, C represent ohms, henrys, and farads of the respective elements. By dividing each term by $j\omega$, the value of the three elements assume the values of $1/j\omega$ $1/R$, L, and $1/\omega^2 C$, respectively, whereby such values are best represented by a capacitor, a resistor, and an active circuit, respectively, having the appropriate value of reactance.

Figure 2:
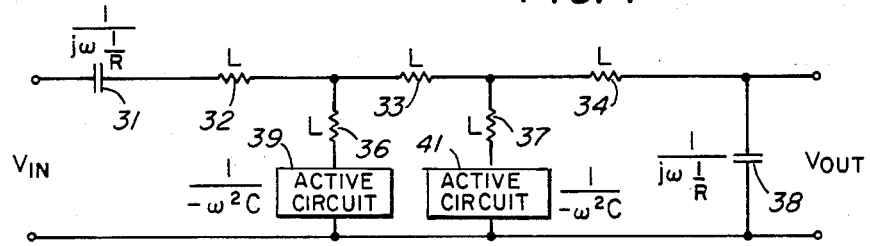
FIG. 2 is a transformed circuit of FIG. 1 with all element values dividing by $j\omega$, where $\omega$=angular frequency.
Figure 3:
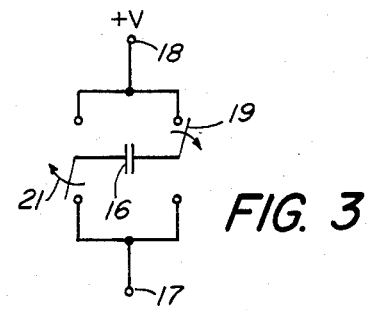
FIG. 3 is a schematic representation of a switched capacitor, helpful for understanding an embodiment of the invention.

In turn, the resistors of FIG. 2 are replaced by switched capacitors, a schematic representation of one being illustrated in FIG. 3. The switched capacitor of FIG. 3 can be switched electronically by the circuit depicted in FIG. 4.

In FIG. 4, two MOS transistors 11, 12, in series, are coupled in parallel with serially connected MOS transistors 13, 14 across a voltage potential +V, the transistors being coupled in source-drain relationship. The junction of the transistors 11, 12 is coupled to one plate of the switching capacitor 16, the other plate being coupled to the junction of the transistor 13, 14. A gating signal Q is simultaneously applied to the gate electrodes of the transistors 11, 14. A complementary (or inverted) gating signal is simultaneously applied to the gate electrodes of the transistors 12, 13.

Referring to FIG. 3, assume the lower terminal 17 is coupled to a point of reference potential, such as ground, and the upper terminal 18 is coupled to a positive potential +V. With switches 19, 21 in the position illustrated, the right plate of the capacitor is charged positively with respect to the left plate.

Normally, a capacitor would not pass direct current, but when the switches are in the position as shown, the capacitor 16 is charged. When the switches 19, 21 are reversed, the charge is dissipated, and the capacitor 16 is recharged in the opposite direction. As this switching is repeated, an average current, consisting of pulses, travels from +V to ground. Average current gives rise to an effective resistance. The value of the equivalent resistance is represented by the equation $R_{eq}=1/fC$, where f represents the frequency with which the switches change state, and C is the capacitance, in farads, of the switched capacitance. When a filter is formed with such a switching capacitor, generally, the response of the filter is related to the RC product. Thus, assuming a serial resistance of 1/fC and a shunt capacitance of $C_1$, the filter response becomes a function of the ratio of $C_1$ to C. Ratios in integrated circuits, especially capacitor ratios, can be controlled very tightly. All RC products are defined by the clock frequency and capacitor ratios, thereby making the filter transfer function very stable with absolute variations in component values. An additional advantage of implementing resistors with switched capacitors is that the needed large resistor values ($10^6 \Omega$) can be obtained in a small area.

Figure 6:
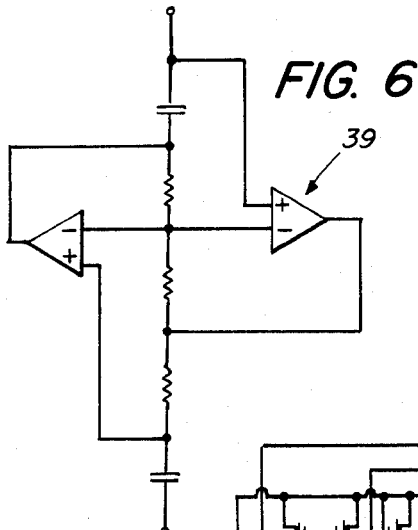
FIG. 6 is a schematic representation of a frequency dependent negative resistance (FDNR) circuit helpful for understanding this invention.

Referring to FIG. 5, there is shown a circuit, suitable for integration, that is the equivalent of that depicted in FIG. 2, like reference numerals referring to elements that perform like functions. For example, the switched capacitor 36 in FIG. 5 replaces the resistor 36 in FIG. 2. The entire circuitry 39 including switched capacitors and operational amplifiers of FIG. 5 replaces the active circuit 39 of FIG. 2. The entire circuit 39 is shown in FIG. 6 with resistors, but in actual implementation would be replaced with switched capacitors. The circuit 39, FIG. 6, acts as a frequency-dependent negative resistance as (FDNR).

The problem: when two resistors, which have been implemented with switched capacitors, are connected in series, charge gets trapped and disrupts operation.

The invention relates to the addition of fixed capacitors across the switched capacitors, removing the charge and providing stabilization.

Figure 7:
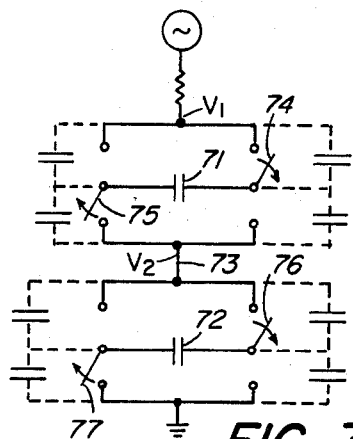
FIG. 7 is a circuit diagram including two switching capacitors, without floating node correction, useful for an understanding of this invention.

As an explanation of what occurs in the absence of the added fixed capacitors, reference is made to FIG. 7 which illustrates two switched capacitors 71, 72 in series. A sinusoidal voltage is applied to one switched capacitor 71, the other switched capacitor 72 being coupled to a point of reference potential, such as ground. The voltage appearing at the junction 73 of the two switched capacitors 71, 72 is illustrated in FIG. 7(a), the maximum amount being limited by amplifier clipping as indicated at 74.

When a steady state voltage is applied across the two switching capacitors 71, 72, the voltage at the junction 73 generally assumes a value other than that of half of the applied voltage, because the switches 74, 75, 76, 77 that operate upon the switching capacitors 71, 72 are transistors, and capacitive coupling exists, as indicated by dotted line format. With an initial imbalance, as the capacitors 71, 72 are switched, the voltage at the junction 73 oscillates about the midpoint of the steady state voltage applied across the switching capacitors 71, 72.

Figure 7A:
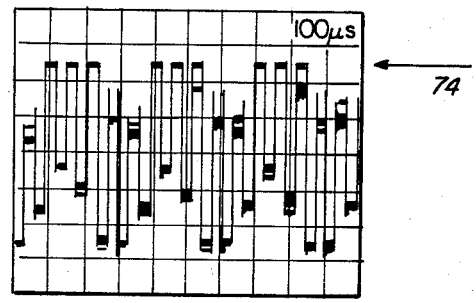
FIG. 7(a) is a waveform of a voltage obtainable at the junction of the two switching capacitors of FIG. 7.

With a sinusoidal voltage applied across the switching capacitors 71, 72 of FIG. 7, the voltage at the junction 73 approaches a sinusoidal form, having amplitude clipping, with a superimposed imbalance which oscillates at the switching rate, as indicated in the waveform of FIG. 7(a).

With a signal applied across the switching capacitors 71, 72 of FIG. 7, an attenuated signal thereof might be expected to be present at the junction 73 of the switched capacitors 71, 72. In practice, however, the resulting signal is a modulated square wave, the square wave occurring at the switching frequency of the switched capacitors 71, 72. In accordance with a preferred mode, the switching occurs at a 32 kilohertz rate.

Figure 8:
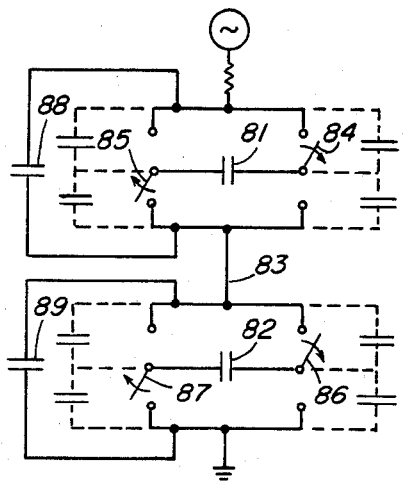
FIG. 8 is a circuit diagram of two serially connected switching capacitors, with a pair of fixed capacitors coupled thereacross and coupled at their junctions to provide floating node correction, in accordance with the invention.
Figure 8A:
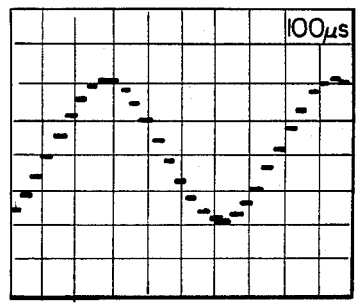
FIG. 8(a) is a waveform of the voltage obtainable at the junction of the switching capacitors of FIG. 8.

The modulated square wave of FIG. 7(a) can be eliminated, and a signal approximating the applied signal, of the nature depicted in FIG. 8(a), can be provided by the addition of two fixed capacitors. As shown in FIG. 8, two switched capacitors 81, 82 are coupled in series across a signal source. The switched capacitor 81 has its plates alternately switched from the signal source and the capacitors junction 83 by switches 84, 84; the switched capacitor 82 has its plates alternately switched from the junction 83 and the point of reference potential (such as ground) by switches 86, 87. The switches 84, 85, 86, 87 can be MOS transistors.

The circuit of FIG. 8 is provided with a fixed capacitor 88 across the signal source and the junction 83; a fixed capacitor 89 is coupled across the junction 83 and the point of reference potential, such as ground. Effectively, the capacitors 88, 89 are coupled in series across the switched capacitors 81, 82, with the junction of the serially connected capacitors 88, 89 coupled to the junction 83 of the switched capacitors 81, 82.

The filter implementation with switched capacitors is shown in FIG. 5. The FDNR section is located to the left of node A. In a preferred mode, the switches are implemented with MOS transistors; the capacitors, with two layers of polysilicon. Although the absolute value of capacitance can vary by ±20% or more, the capacitance ratios stay constant since they are determined by mask geometry. The input to the filter is supplied via a sampling circuit consisting of $C_1$ and $C_2$, which sample the input at twice the clock frequency (f). The input is buffered with a unity gain amplifier OP1. The output of the FDNR filter is buffered with an amplifier OP6.

Note that with the link x-y open, node A (the positive input to OP6) has no dc path to ground and is, therefore, floating. For proper operation, this node should be maintained at approximately 0 Vdc. This is difficult to achieve since the ac resistance between node A and ground should be greater than 200 megohms to maintain the proper frequency response. These requirements are satisfied by controlling the dc voltage at node A with a voltage-controlled current source which is driven with the integrated output of the amplifier OP6. This floating node stabilizing circuit also acts as a high-pass filter that provides 8 db of attenuation at 60 Hz.

Floating node stabilization is supplied from a 4:1 resistive divider R1 and 3R1. Resistors R1 and 3R1 are the main elements of the voltage attenuator, while resistors R3 through R7 are used to trim the gain of the amplifier by selectively blowing their associated polysilicon fuses F5 through F7. The gain can be incrementally adjusted.

Switched capacitors C7, C8, C15, C16, C21 and C22 are shunted by capacitors C7A, C8A, C15A, C16A, C21A and C22A, respectively. These capacitors stabilize the FDNR branches by removing "trapped charge," which otherwise disrupt operation.

Figure 9:
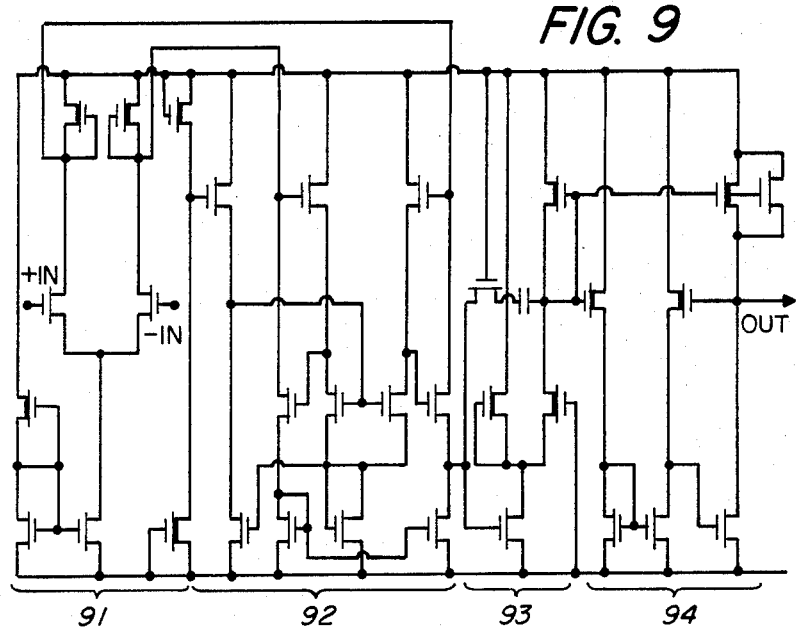
FIG. 9 is a circuit diagram of an operational amplifier, useful in conjunction with the invention.

An operational amplifier, of the type depicted as OP1 through OP8 in FIG. 5, has its circuit diagram shown in FIG. 9. It consists of a differential section 91, a circuit 92 for differential to single-ended conversion, a high-gain stage 93 and a driver stage 94. The op-amp can drive a load of 10 kilohms and provide an output of ±3.2 V.

The switched capacitor 16 of FIG. 4 is implemented with MOS transistors 11, 12, 13, 14 which provide bidirectional switching to accommodate positive and negative analog voltages. This is achieved by providing the switch transistors 11, 12, 13, 14 with a turn-on voltage of +5 V and a turn-off voltage of −5 V at the gate. Since a standard logic signal is only 0 V to +5 V, a special switch driver is provided. Such a driver is shown in FIG. 10. Here, transistors T1 and T2 provide level shifting of the logic signal at the input for proper switching drive for transistor T4. Transistor pairs T3/T4 and T5/T6 comprise the standard inverter stages. The transistors T1/T2 provide a level shifting function. Enhancement transistors can be used for T1 and T2, thereby providing good operating margins with variations in circuit parameters and supply voltages.

Following is an explanation of how the invention solves the "charge accumulation" problem:

Assume that the op-amp of FIG. 9 is driving a resistive divider of FIG. 7 at a constant +4 volts and that the bottom capacitor acquired a voltage of +3 volts at t<T. At t=T, the terminals of both capacitors are reversed. During this transient condition, $V_1$ starts at −3 volts and $V_2$ at −4 volts. This causes a charging current, which makes $V_1$=4 volts after the circuit reaches steady state (during T<t<2 T). Since $V_1$ increased by 8 volts and the two capacitors are equal, $V_2$ must increase by 4 volts. As a result, the steady state voltage of $V_2 = -3+4 = +1$ volt is reached. The same reasoning for the next clock period results in $V_2 = +3$ volts. As the capacitors are switched at a 32 kHz clock frequency, the steady state voltages of $V_2$ fluctuate between +3 volts and +1 volt with the same period as that of the clock frequency.

This problem is solved by shunting the switched capacitors with unswitched capacitors as shown in FIG. 8. Assume, as before, a constant voltage is applied to the resistors and that $V_2$ has an initial voltage of +3 volts. When the switched capacitors are reversed at t=T, the voltages of the switched capacitors oppose the voltages of the unswitched capacitors. As a result, $V_1$ and $V_2$ become zero. This causes a charging current which makes $V_1 = +4$ volts and $V_2 = +2$ volts. At t=2 T, when the switched capacitors are reversed again, the situation is identical to that when t=T, and $V_2$ again reaches +2 volts. Thus $V_2$ stays at +2 volts as the switched capacitors are repeatedly reversed. The switched capacitors thus act as a 2:1 voltage divider for a +4 volts input. The filter output waveform, after adding the charge removal capacitors, is shown in FIG. 8(a).

In summary, when switched capacitor resistors are connected serially, a condition can arise where charge gets trapped on the switched capacitors. This was observed in the switched capacitor of FIG. 7. The trapped charge bounces back and forth between two capacitors 71, 72 causing a square wave at the clock period to appear at the internal nodes 73 and the output. The output under these conditions is shown in FIG. 7(a). The amplitude of the superimposed square wave causes the op-amps to overload and completely disrupt operation.

What is claimed is:

1. In a switched capacitor filter including two switching capacitors, one of said switching capacitors capable of having one plate thereof switched between a first voltage potential and a nodal point and to have a second plate thereof switched between said nodal point and said first voltage potential, and the other of said switching capacitors capable of having one plate thereof switched between said nodal point and a second voltage potential and to have a second plate thereof switched between said second voltage potential and said nodal point, the switching of said plates occurring synchronously whereby repetitive switching tends to cause an undesirable charge to accumulate at said nodal point, the improvement for preventing said undesirable charge from accumulating on said nodal point comprising a first fixed capacitor coupled across said first voltage potential and said nodal point, and a second fixed capacitor coupled across said second voltage potential and said nodal point.

2. A frequency dependent negative resistance filter with floating node correction comprising an input terminal, a first capacitor, a first switched capacitor resistor, a second switched capacitor resistor, a third switched capacitor resistor, and an output terminal, coupled in serial order;

a first shunt path coupled between the coupling of said first and said second switched capacitor resistors and a point of reference potential comprising a fourth switched capacitor resistor, a second capacitor, a fifth switched capacitor resistor, a sixth switched capacitor resistor, a seventh switched capacitor resistor, and a third capacitor, coupled in serial order, a first operational amplifier having a first input terminal of one polarity coupled to a junction of said fourth switched capacitor resistor and said second capacitor, a second input terminal of an opposite polarity coupled to a junction of said fifth and said sixth switched capacitor resistors, and an output terminal coupled to a junction of said sixth and said seventh switched capacitor resistors, a second operational amplifier having a first input terminal of said one polarity coupled to a junction of said seventh switched capacitor resistor and said third capacitor, a second input terminal of said opposite polarity coupled to a junction of said fifth and said sixth switched capacitor resistors, and an output terminal coupled to a junction of said fifth switched capacitor resistor and said second capacitor,
a first fixed capacitor coupled across said fifth switched capacitor resistor, and
a second fixed capacitor coupled across said sixth switched capacitor resistor;
a second shunt path coupled between the coupling of said second and said third switched capacitor resistors and said point of reference potential comprising
an eighth switched capacitor resistor, a fourth capacitor, a ninth switched capacitor resistor, a tenth switched capacitor resistor, an eleventh switched capacitor resistor, and a fifth capacitor coupled in serial order,
a third operational amplifier having a first input terminal of said one polarity coupled to a junction of said eighth switched capacitor resistor and said fourth capacitor, a second input terminal of said opposite polarity coupled to a junction of said ninth and said tenth switched capacitor resistors, and an output terminal coupled to a junction of said tenth and said eleventh switched capacitor resistors,
a fourth operational amplifier having a first input terminal of said one polarity coupled to a junction of said eleventh switched capacitor resistor and said fifth capacitor, a second input terminal of said opposite polarity coupled to a junction of said ninth and said tenth switched capacitor resistors, and an output terminal coupled to a junction of said ninth switched capacitor resistor and said fourth capacitor,
a third fixed capacitor coupled across said ninth switched capacitor resistor, and
a fourth fixed capacitor coupled across said tenth switched capacitor resistor; and
a third shunt path coupled across said output terminal and said point of reference potential comprising a sixth capacitor.

3. In combination,
a first switching capacitor having a pair of plates;
a first MOS transistor having a source electrode coupled to a first electrical junction, a drain electrode coupled to one of said plates of said first switching capacitor, and a gate electrode capable of receiving a bipolar gating signal;
a second MOS transistor having a source electrode coupled to said one of said plates of said first switching capacitor, a drain electrode coupled to a nodal point, and a gate electrode capable of receiving an inverted version of said bipolar gating signal;
a third MOS transistor having a source electrode coupled to said first electrical junction, a drain electrode coupled to another of said plates of said first switching capacitor, and a gate electrode capable of receiving said inverted version of said bipolar gating signal;
a fourth MOS transistor having a source electrode coupled to said another of said plates of said first switching capacitor, a drain electrode coupled to said nodal point, and a gate electrode capable of receiving said bipolar gating signal;
a second switching capacitor having a pair of plates;
a fifth MOS transistor having a source electrode coupled to said nodal point, a drain electrode coupled to one of said plates of said second switching capacitor, and a gate electrode capable of receiving said bipolar gating signal;
a sixth MOS transistor having a source electrode coupled to said one of said plates of said second switching capacitor, a drain electrode coupled to a second electrical junction, and a gate electrode capable of receiving said inverted version of said bipolar gating signal;
a seventh MOS transistor having a source electrode coupled to said nodal point, a drain electrode coupled to another of said plates of said second switching capacitor, and a gate electrode capable of receiving said inverted version of said bipolar gating signal;
an eighth MOS transistor having a source electrode coupled to said another of said plates of said second switching capacitor, a drain electrode coupled to said second electrical junction, and a gate electrode capable of receiving said bipolar gating signal;
a first fixed capacitor coupled across said first junction and said nodal point; and
a second fixed capacitor coupled across said nodal point and said second junction.

4. In combination
a first capacitor having a pair of plates;
a second capacitor having a pair of plates;
means for alternately (1) coupling one of said plates of said first capacitor to a first source of voltage potential, the other of said plates of said first capacitor to one of said plates of said second capacitor as a nodal point, and the other of said plates of said second capacitor to a second source of voltage potential, and (2) coupling said other of said plates of said first capacitor to said first source of voltage potential, said one of said plates of said first capacitor to said other of said plates of said second capacitor as said nodal point, and said one of said plates of said second capacitor to said second source of voltage potential;
a third capacitor having a first plate capable of being coupled to said first source of voltage potential, and having a second plate coupled to said nodal point; and
a fourth capacitor having a first plate coupled to said nodal point and, having a second plate capable of being coupled to said second source of voltage potential.

* * * * *